US005482883A

United States Patent [19]

Rajeevakumar

[11] Patent Number: 5,482,883
[45] Date of Patent: Jan. 9, 1996

[54] METHOD FOR FABRICATING LOW LEAKAGE SUBSTRATE PLATE TRENCH DRAM CELLS AND DEVICES FORMED THEREBY

[75] Inventor: Thekkemadathil V. Rajeevakumar, Scarsdale, N.Y.

[73] Assignee: International Business Machines Corporation, Armonk, N.Y.

[21] Appl. No.: 337,570

[22] Filed: Nov. 10, 1994

Related U.S. Application Data

[62] Division of Ser. No. 160,537, Dec. 1, 1993, Pat. No. 5,406,515.

[51] Int. Cl.⁶ .................................. H01L 21/8242
[52] U.S. Cl. .......................... 437/52; 437/60; 437/919
[58] Field of Search .......................... 437/47, 52, 60, 437/67, 203; 257/300–305; 148/DIG. 50

[56] References Cited

U.S. PATENT DOCUMENTS 4,784,969  11/1988  Nitayama ................................. 437/52
4,830,981   5/1989  Baglee et al. ........................... 437/52

OTHER PUBLICATIONS

IBM TDB, vol. 31, No. 7, Dec. 1988 pp. 409–414 High Density Memory Cell Structure with two access transistors.

*Primary Examiner*—Tom Thomas
*Attorney, Agent, or Firm*—Scully, Scott, Murphy & Presser

[57] ABSTRACT

Methods for fabricating low leakage trenches for Dynamic Random Access Memory (DRAM) cells and the devices formed thereby are disclosed. In one embodiment of the present invention, the method includes forming a diffusion ring surrounding an upper portion of the trench. In another embodiment, a portion of the diffusion ring extends to the surface of a substrate. The diffusion ring can be formed by outdiffusing a dopant from a doped material deposited within the trench. In a further embodiment, the present method includes forming an insulating ring surrounding an upper portion of the trench. The insulating ring can be formed by thermal oxidation or by etching a sidewall shallow trench and depositing an insulating material therein. In another embodiment, a portion of the insulating ring extends to the surface of the substrate.

24 Claims, 7 Drawing Sheets

METHOD FOR FABRICATING LOW LEAKAGE SUBSTRATE PLATE TRENCH DRAM CELLS AND DEVICES FORMED THEREBY

This is a divisional of application Ser. No. 85/160,537, filed on Dec. 1, 1993, now U.S. Pat. No. 5,406,515.

BACKGROUND OF THE INVENTION

1. Field of the Invention

The present invention relates generally to a method for making an improved trench for a semiconductor memory device and the device formed thereby and, more particularly, to a method for fabricating a low leakage trench for a Dynamic Random Access Memory (DRAM) cell wherein trench parasitic sidewall leakage currents from a bitline contact to the storage node and from the storage node to the substrate are eliminated by an insulating or diffusion ring surrounding an upper portion of the trench.

2. Description of the Prior Art

There are many DRAM applications where it is important to maximize the retention time of the cell. In particular, applications depending on battery power for the system would benefit from a DRAM cell which did not need to be refreshed very often. Very Large Scale Integrated (VLSI) DRAM cells in the time frame of 4 Mbit and beyond require trench storage capacitors in order to meet high density requirements. DRAM cells having a storage capacitor disposed in a trench formed in a semiconductor substrate are known in the art. For example, U.S. Pat. No. 4,688,063 assigned to the same assignee as the present invention, which patent is hereby incorporated by reference, discloses a substrate plate trench (SPT) DRAM cell which utilizes a trench storage capacitor formed in a semiconductor substrate. A portion of the substrate is heavily doped and forms the counterelectrode of the storage capacitor while a heavily doped polycrystalline plug disposed in the trench forms the other electrode of the storage capacitor. The SPT DRAM cell includes a field effect access transistor disposed in a well which is opposite in conductivity type to that of the substrate. The trench capacitor extends from the surface of the well, through the well and lightly doped substrate portion, into the heavily doped portion of the substrate. The capacitor electrode disposed in the trench is directly connected to the source/drain of the access transistor.

Trench DRAM cells suffer from two main disadvantages resulting from a parasitic sidewall leakage current. The two disadvantages are the trench parasitic sidewall leakage through the trench sidewalls (1) from the bitline contact to the storage node and (2) from the storage node to the substrate. The latter leakage mechanism is described in Lu et al., "A Substrate Plate Trench Capacitor (SPT) Memory Cell for Dynamic RAM's", *IEEE J. of Solid State Circuits*, Vol. SC-21, No. 5, pp. 627–633 (1986) and Noble et al., "Parasitic Leakage in DRAM Trench Storage Capacitor Vertical Gated Diodes", *IEDM Tech. Digest*, pp. 340–343 (1987).

To reduce these leakage currents, the DRAM cell of U.S. Pat. 4,688,063 includes an n-well interposed between the substrate plate and the access transistor electrodes. As described in Cottrell et al., "N-Well Design for Trench DRAM Arrays", *IEDM Tech. Digest*, pp. 584–587, 1988, to further increase the immunity of an SPT DRAM cell to leakage current an n-well with a doping profile that monotonically decreases with depth can be utilized. However, these improvements do not significantly reduce the trench parasitic sidewall leakage currents.

Another way to reduce the parasitic sidewall leakage currents is by increasing the thickness of an oxide collar formed within an upper portion of the trench. However, increasing the collar thickness reduces the contact area available for contact, increases the RC time constant of the storage node polysilicon and introduces process constraints.

A further way to reduce the sidewall leakage currents is disclosed in a co-pending application, assigned to the same assignee as the present application, Ser. No. 696,691, filed May 7, 1991. The application discloses an SPT DRAM cell which includes a buried oxide collar surrounding an upper portion of the trench of the storage capacitor and extends from the n-well through the n-well and into a lightly doped portion of the substrate. The oxide collar is contiguous with an insulating layer formed within the trench on all sides. However, since the oxide collar does not extend to the surface of the substrate, this DRAM cell does not reduce the leakage current from the storage node to the bitline contact. Moreover, by extending the oxide collar through the n-well and into the lightly doped substrate portion, this DRAM cell results in additional leakage problems. The method for fabricating this DRAM cell includes forming a thick oxide layer on an upper portion of the substrate. The oxide layer is then buried within an upper portion of the substrate by conventional epitaxial overgrowth technology. A trench is then dug down to and through the buried oxide layer and the substrate such that the oxide layer completely surrounds an upper portion of the trench.

U.S. Pat. No. 4,987,470 discloses a DRAM device which includes a field shield conducting layer placed inside a trench to prevent parasitic sidewall leakage through the trench sidewalls. The conductive shield layer is disposed between the trench sidewall and the storage node with insulating material between them. The conductive layer shields the field from the storage polysilicon. However, the use of the shield layer within the trench does not substantially prevent parasitic leakage currents. Thus, there is a need to develop a DRAM cell that significantly reduces trench parasitic sidewall leakage currents from the bitline contact to the storage node and from the storage node to the substrate.

SUMMARY OF THE INVENTION

The present invention is directed to methods for fabricating a low leakage trench for a DRAM cell and the devices formed thereby wherein trench parasitic sidewall leakage currents from a bitline contact to the storage node and from the storage node to the substrate are substantially reduced by an insulating or diffusion ring surrounding an upper portion of the trench. The starting structure for all the methods of the present invention is a substrate of a first conductivity type having a lightly doped upper portion and a heavily doped lower portion.

In one embodiment of the method of the present invention a nitride/oxide protective layer is deposited on the substrate. Next, a trench is etched at a first region to a first depth which is more than the expected source/drain depth but less than the expected n-well depth. A nitride collar is then formed on the vertical surfaces of the trench. The trench is then etched to a second depth which is still less than the expected n-well depth. Next, a layer of doped material having a dopant of the second conductivity type is deposited within the trench. The dopant is then outdiffused into the trench sidewalls to form a diffusion ring of the second conductivity type extending from the nitride collar and within the upper portion of the substrate.

After outdiffusion, the doped material remaining in the trench is removed. The trench is then etched to a third and final depth into the lower portion of the substrate such that said diffusion ring surrounds an upper portion of the trench. The diffusion ring is contiguous with the trench on all sides and not within the trench. Thereafter, conventional DRAM processing techniques are utilized to complete the DRAM cell of the present invention.

In another embodiment of the present invention, one of the sides of the trench is selectively doped all the way to the surface of the substrate to further reduce the leakage from the storage node to the bitline contact. In accordance therewith, after fabricating the nitride layer on vertical surfaces to the first trench depth, a planarization resist is formed within the trench. A photoresist and masking step is then used to expose one side of the nitride layer. The exposed portion of the nitride layer is then removed. The trench is then etched to the second depth and a layer of doped material with the second conductivity dopant is deposited in the trench. The dopant is outdiffused to form a second conductivity type diffusion ring surrounding a portion of the trench, contiguous with the trench on all sides and extending to the surface of the substrate on the side of the trench where the nitride layer was removed. The remaining doped material is removed and the trench etched to its final depth. From this point, the conventional DRAM process is carried out to complete the DRAM cell of the present invention.

Another embodiment of the present invention is directed to a method for fabricating a DRAM cell wherein an insulating ring surrounding an upper portion of the trench is utilized to reduce trench parasitic sidewall leakage currents. In accordance with this embodiment, after etching the trench to a first depth, a layer of oxide is thermally grown on all vertical and horizontal surfaces of the trench. A nitride layer is then formed on the lower vertical and horizontal surfaces of the trench. A further nitride layer is then formed on the uppermost vertical surfaces of the trench thereby leaving an upper portion of the trench sidewalls between the two nitride layers exposed. Next, the silicon not protected by the two nitride layers (i.e., in the upper portion of the trench) is thermally oxidized to form an insulating ring within the upper portion of the substrate and a portion of the trench and being contiguous with the trench on all sides. The insulating ring can be comprised of a material such as an oxide or oxynitride.

After oxidation, the nitride layers are removed and another nitride layer is formed on all surfaces of the trench. The trench is then etched to a second and final depth to extend within the lower portion of the substrate such that the insulating ring surrounds an upper portion of the trench. The insulating ring is contiguous with the trench on all sides and not within the trench. As in the embodiments described above, conventional DRAM processing is utilized to finish the DRAM cell of the present invention.

In an alternative embodiment of forming the insulating ring of the present invention, the exposed silicon sidewalls of the trench between the two nitride layers is isotropically etched to form a sidewall shallow trench. The sidewall shallow trench is then filled with an insulating material to form the insulating ring of the present invention. Suitable materials for this insulating ring include an oxide, oxynitride or silicon nitride. Again, conventional DRAM processing is followed thereafter to fabricate the DRAM cell.

In accordance with a further embodiment of the present invention and to further reduce the leakage from storage node to bitline contact through the adjacent trench sidewall, one of the sides of the trench is selectively oxidized all the way to the surface of the substrate. In accordance therewith, one side of the nitride layer on the uppermost vertical surface of the trench is removed prior to oxidation. After oxidation, the resulting insulating ring includes one side which extends to the surface of the substrate. A protective nitride collar is then formed around the trench to protect the insulating ring and the trench is etched to its final depth. Subsequently, the conventional DRAM process is carried out to complete the DRAM cell of the present invention.

DETAILED DESCRIPTION OF THE INVENTION

The present invention is directed to methods for fabricating trench DRAM cells and the devices formed thereby wherein a trench parasitic sidewall leakage current through the trench sidewall from a bitline contact to the storage node and from the storage node to the substrate is substantially reduced. While the methods of the present invention will be described in connection with forming a single substrate plate trench (SPT) DRAM cell, it should be understood that a plurality of SPT DRAM cells can be formed in the well and fabricated simultaneously therein in the same manner as described hereinbelow. It should also be understood that while the process will be described in connection with forming the DRAM cell in a p-type substrate (n-well) the features of the present invention may easily be adapted for forming the DRAM cell in an n-type substrate (p-well).

Referring now to FIGS. 1–5, there is shown cross-sectional views disclosing the fabrication of a DRAM cell of the present invention at successive stages in accordance with one embodiment of the method of the present invention. The fabrication of the DRAM cell of the present invention is begun by starting with a substrate 10 having a lightly doped upper portion 12 of a p– conductivity type and a heavily doped lower portion 14 of a p+ conductivity type. The substrate 10 can be a semiconductor material such as silicon. The substrate 10 shown in FIG. 1, having a substantially planar surface 16 is the starting point for the methods of the present invention.

Figure 1:
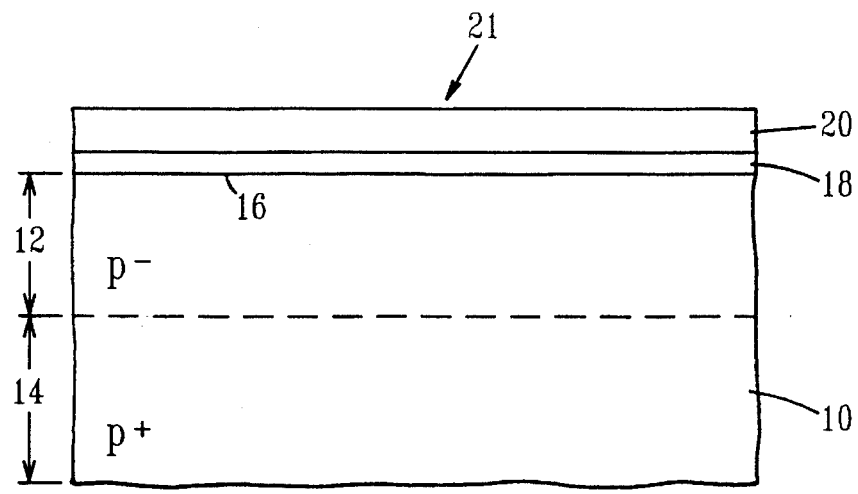
FIGS. 1–5 are cross-sectional views showing the fabrication of one embodiment of a DRAM cell of the present invention at successive stages in accordance with one embodiment of the method of the present invention.
Figure 2:
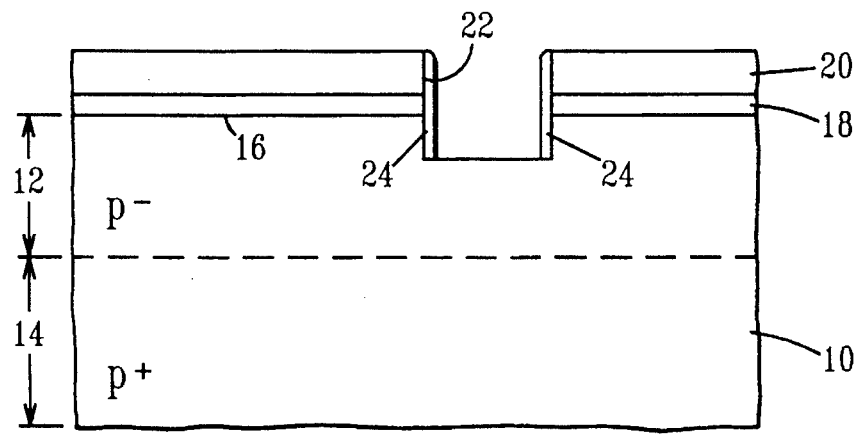

To protect the substrate 10 from subsequent processing steps, a layer of nitride 18 and a layer of oxide 20 is deposited on substrate 10 by any well known wet or dry deposition process. Next, the structure 21 is patterned using a trench mask by well known techniques. As shown in FIG. 2, a trench 22 is etched into the upper portion 12 of substrate 10 in the unmasked portion. The trench is etched to a depth (typically 0.5–0.6 μm) more than the expected source/drain junction depth but less than the expected n-well depth. The trench can be etched by an anisotropic etching process such as plasma etching or reactive ion etching (RIE). Next, a nitride layer 24 is deposited. Next, the nitride layer 24 is anisotropically etched to remove portions of the nitride layer 24 formed in the horizontal surface 26 while retaining the vertical sections on the sidewalls of the trench 22 to create the nitride collar 24 shown in FIG. 2.

Figure 3:
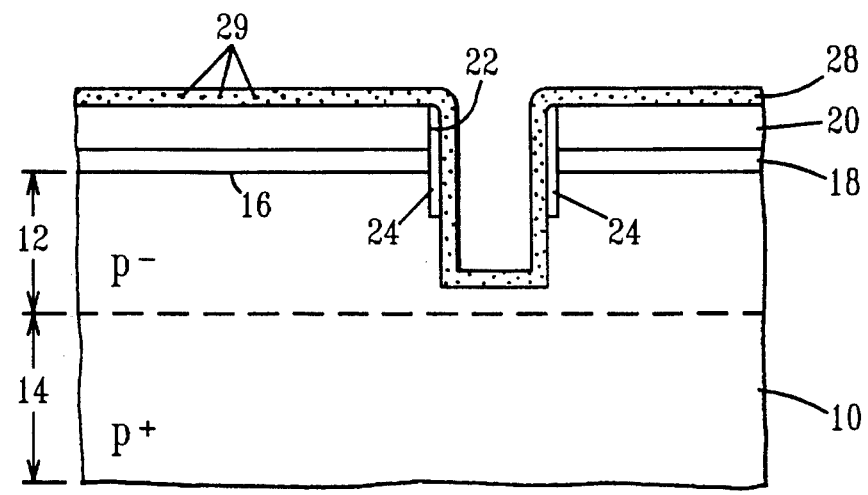

As shown in FIG. 3, the trench 22 is further etched to a second depth which is still less than the expected n-well depth. The second depth is preferably less than the expected n-well depth to avoid leakage problems which can arise due to the diffusion ring (described below) of the present invention extending through the n-well and into the lightly doped portion 12 of substrate 10. Next, a layer 28 of a doped material having an n-type dopant 29 is deposited within trench 22 and the surface of the oxide layer 20. The layer 28 of doped material can be deposited by well known chemical vapor deposition (CVD) methods. Suitable materials for doped layer 28 include arsenic doped glass, phosphorus doped (phosphosilicate) glass and antimony doped glass.

Figure 4:
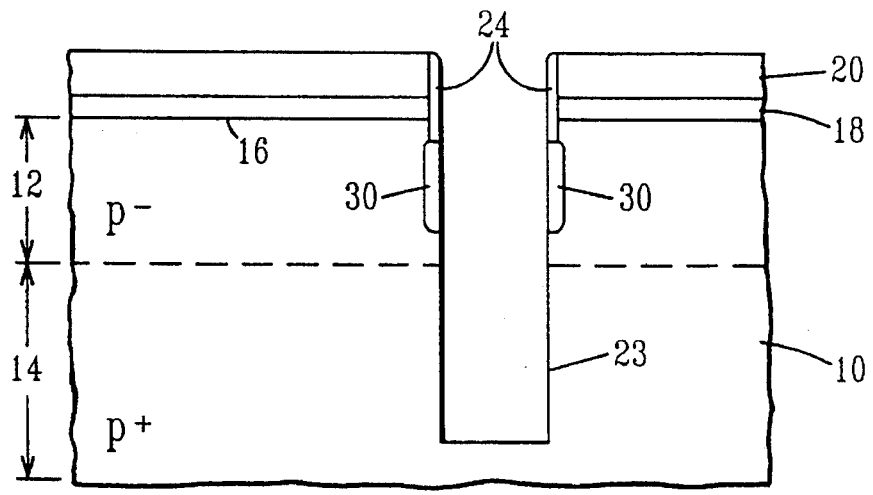

Turning now to FIG. 4, the next step is to out diffuse the dopant 29 (e.g., arsenic) into the trench sidewalls to form an n+ diffusion ring 30 surrounding a portion of the trench 22 and being contiguous with the trench 22 on all sides. Rapid thermal annealing or furnace diffusion can be used to out diffuse the dopant 29 and form the n+ diffusion ring 30. As an example, an annealing temperature between about 900° to 1200° C. for about one to six hours can be used to form diffusion ring 30. After out diffusion, the layer of doped material within trench 22 is isotropically etched and removed. Next, the trench 22 is etched to a third and final depth through the upper portion 12 and into the lower portion 14 of substrate 10 to produce the trench 23 shown in FIG. 4. Thus, the method of the present invention fabricates a diffusion ring 30 surrounding an upper portion of trench 23, is contiguous with trench 23 on all sides and not within trench 23.

Figure 5:
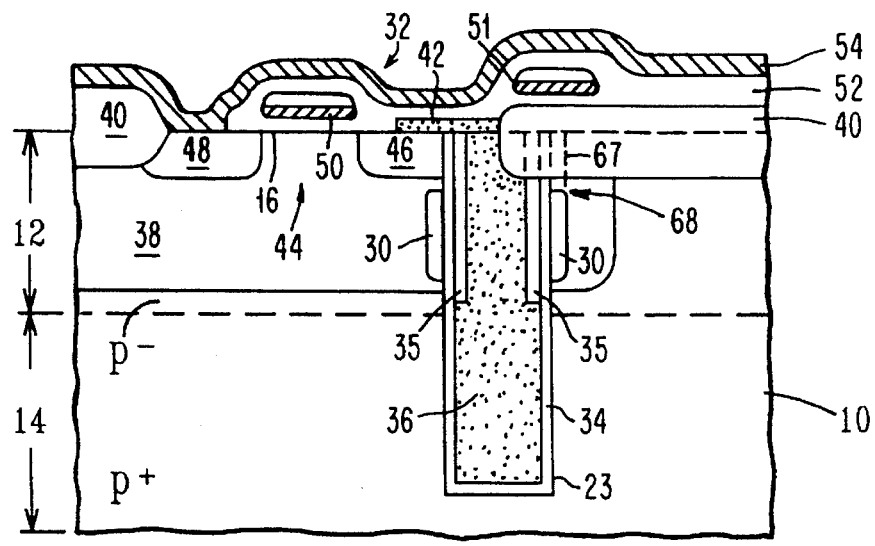

From this point, the conventional DRAM cell process can be followed to complete the DRAM cell of the present invention which is shown in FIG. 5. The diffusion ring 30 reduces a horizontal trench parasitic sidewall leakage current from a bitline contact to the storage node and the leakage current from the storage node to the substrate by several orders of magnitude.

The details of the conventional process are disclosed in detail in a co-pending application, assigned to the same assignee as the present application, Ser. No. 696,691, filed May 7, 1991 and Lu et al., "A Substrate-Plate Trench-Capacitor (SPT) Memory Cell for Dynamic RAM's", IEEE J. of Solid State Circuits, Vol. SC-21, No. 5, pp. 627–633 (1986), which patent and article are hereby incorporated by reference, and are summarized hereinbelow. Turning to FIG. 5, there is shown a cross-sectional view of a DRAM cell 32 of the present invention which includes diffusion ring 30. In the conventional process, an insulation layer 34 is formed on the surface of trench 23. Layer 34 may be a single layer of silicon dioxide or preferably may be a composite triple layer made up of alternating layers of silicon dioxide, silicon nitride and silicon dioxide. An optional internal oxide collar 35 can be formed within an upper portion of trench 23. It should be noted that the collar 35 must not be fabricated too thick to avoid reducing the contact area and increasing the RC time constant of the storage node polysilicon.

A layer of heavily doped polycrystalline silicon is then deposited in trench 23 using CVD with boron doping to produce a p+ storage node 36. The layer 36 is deposited in a thickness sufficient to fill trench 23. Substrate 10 is then subjected to an RIE planarization step to remove the polycrystalline layer everywhere down to the top of trench 23. The nitride layer 18 deposited during the formation of the trench 23 acts as an etch stop during the RIE planarization step.

Next, ions are implanted to form n-well 38 which extends beyond diffusion ring 30 within the upper portion 12 of substrate 10. As stated above, this avoids additional leakage problems which can be caused by allowing the diffusion ring 30 to extend through n-well 38 and into upper portion 12. Next, recessed oxide (ROX) regions 40 are formed by thermal oxidation and isolates DRAM cell 32 electrically from other similar cells formed on substrate 10. Then, bridge region or strap 42 and access transistor (e.g., a field effect transistor) 44 is formed having a source region 46, drain region 48 and gate 50. The gate 50 corresponds to a wordline of the cell 32 while a gate 51 corresponds to a passing wordline of another cell formed in substrate 10. The source 46 and storage node 36 are electrically and physically interconnected by the bridge region 42 which can be of heavily doped p+ polycrystalline silicon. Next, boro-phospho silicate glass (BPSG) is deposited and reflowed to form layer 52. Lastly, contacts are open, and M1 metallization is deposited and patterned to form bitline metal interconnection layer 54. Layer 54 may be aluminum or tungsten.

It will be understood by those skilled in the art of the present invention that while only a single SPT DRAM cell 32 has been shown in FIG. 5, a plurality of SPT DRAM cells 32 are normally formed in n-well 38 and fabricated simultaneously therein in the same manner as described hereinabove. It will also be understood that, while an n-well 38 has been shown in FIG. 5, a p-well may just as easily be used. Then, of course, the conductivity types of source 46 and drains 48 and substrate portions 12 and 14 should be changed to n-conductivity type. In addition, the diffusion ring 30 would be of p+ conductivity and the layer 28 of doped material would include a p-type dopant. Suitable materials for a p-type doped layer 28 include boron doped glass and indium doped glass.

Figure 6:
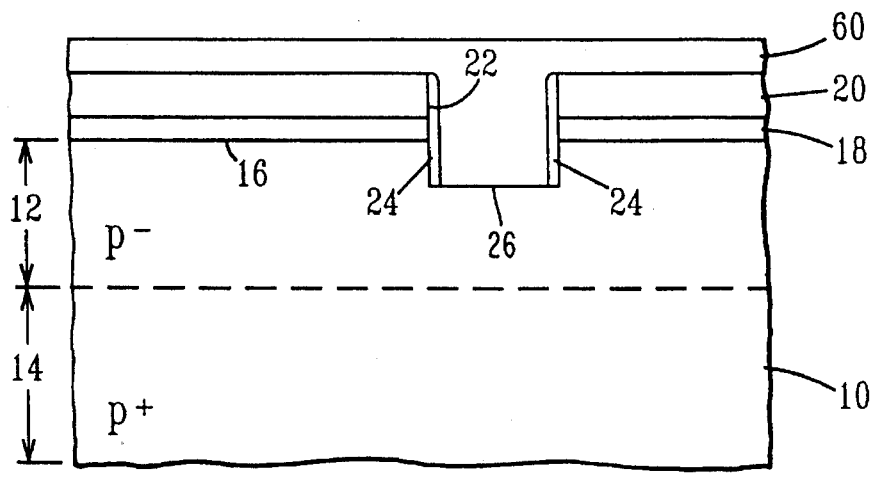
FIGS. 6–9 are cross-sectional views showing the fabrication of another embodiment of a DRAM cell of the present invention at successive stages in accordance with another embodiment of the method of the present invention.

Turning now to FIGS. 6–9, there is shown cross-sectional views of another embodiment of a DRAM cell of the present invention at successive stages in accordance with another embodiment of the method of the present invention. In accordance with this embodiment and to further reduce the leakage from storage mode to bitline contact through the adjacent trench sidewall, one of the sides of the trench away from the source/drain diffusion is selectively doped all the way to the surface of the substrate. In accordance therewith, after fabricating the structure shown in FIG. 2 as described above, a planarization resist 60 is coated on oxide layer 20 and fills trench 22 as shown in FIG. 6. The planarization resist can be coated by any well known method such as spinning the wafer with resist on it.

Figure 7:
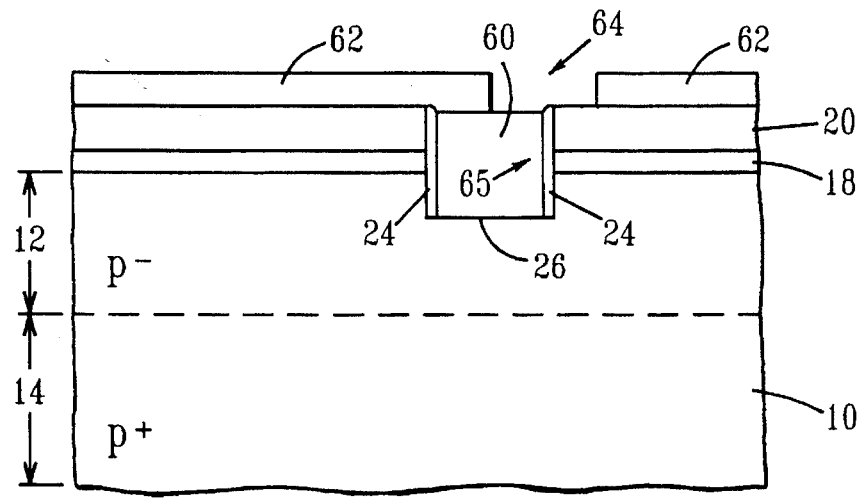
Figure 8:
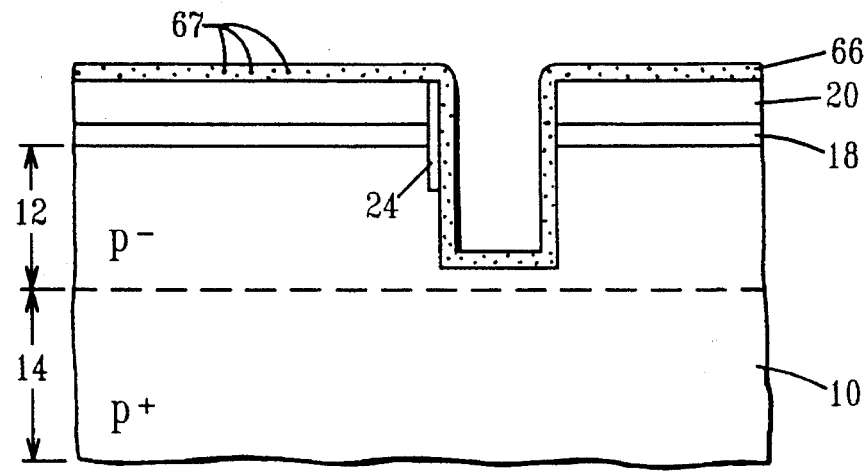

Next, as shown in FIG. 7, the planarization resist 60 is recessed or etched to the level of the oxide layer 20. A photoresist is then coated and etched to form masking layer 62 having an opening 64 to expose the portion 65 of nitride collar 24 on one side of the trench 22. The portion 65 of nitride collar 24 is then removed by hot phosphoric acid as shown in FIG. 8. The planarization resist 60 is now removed by oxygen plasma cleaning.

Figure 9:
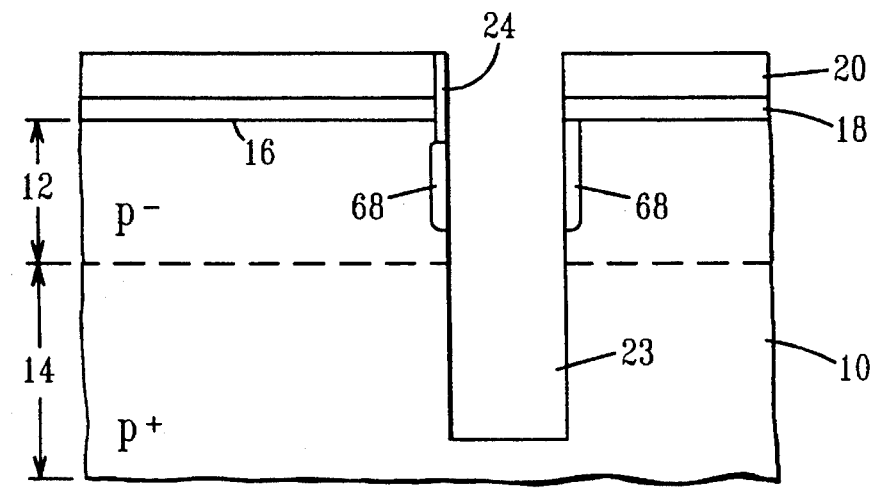

The remainder of the steps are now identical to those described above with regard to FIGS. 3–5 and is summarized below. The trench 22 is further etched to a second depth which is less than the expected n-well depth. Next, a layer 66 of a doped material having an n-type dopant 67 is deposited within trench 22 and on the surface of oxide layer 20. Next, as shown in FIG. 9, the arsenic dopant is outdiffused into the trench sidewalls to form n+ diffusion ring 68 surrounding a portion of trench 22, contiguous with trench 22 on all sides and extending to the surface of substrate 10 on one side of trench 22. The remaining doped layer 66 is then removed and trench 22 is etched to a third and final depth to fabricate the trench 23 shown in FIG. 9.

From this point, the conventional DRAM cell process described above with regard to FIG. 5 can be followed to complete the DRAM cell 32 of the present invention shown in FIG. 5 and includes the diffusion ring 68 which comprises ring 30 and the dotted line portion 67 which extends to the surface 16 of substrate 10. It should be noted that the ROX region 40 does not extend entirely over the right side of the trench. By utilizing the diffusion ring 68 wherein one side thereof extends to the surface of substrate 10 further reduces the sidewall leakage current from the storage node to the bitline contact.

Turning now to FIGS. 10–17, there is shown cross-sectional views disclosing the fabrication of a DRAM cell of the present invention at successive stages in accordance with a further embodiment of the method of the present invention. This method is begun from the structure shown in FIG. 1 which includes substrate 10, lightly doped upper portion 12 of a p–conductivity type, heavily doped lower portion 14 of a p+ conductivity type, nitride layer 18 and oxide layer 20.

In order to describe the subsequent steps of the present method the trench 72 will be described as having first, second and third regions 73, 75 and 77 respectively. The first trench region 73 includes the horizontal surface of the trench and lower vertical surfaces 73. The third trench region 77 comprises the uppermost vertical surfaces of trench 72. The second trench region 75 comprises the vertical surfaces 75 between said first and third regions. The interface between first and second regions 73, 75 can be preferably at a level that is above the expected depth of an n-well (i.e., within the n-well).

Figure 10:
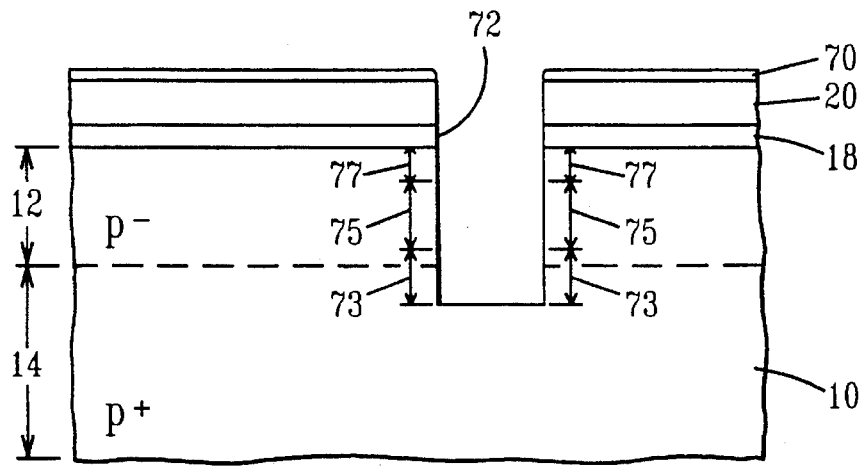
FIGS. 10–17 are cross-sectional views showing the fabrication of a further embodiment of a DRAM cell of the present invention at successive stages in accordance with a further embodiment of the method of the present invention.

As shown in FIG. 10, a layer 70 of nitride is deposited on the oxide layer 20. Next, a trench 72 is etched into the upper portion 12 of substrate 10. The trench 72 is etched to a first depth (typically 0.5– 0.6 μm) more than the expected source/drain junction depth. The trench 72 is shown etched into lower portion 14 to clearly illustrate the fabrication steps of the present method. Alternatively, the trench 72 can be etched to a first depth which is within upper portion 12 of substrate 10.

Figure 11:
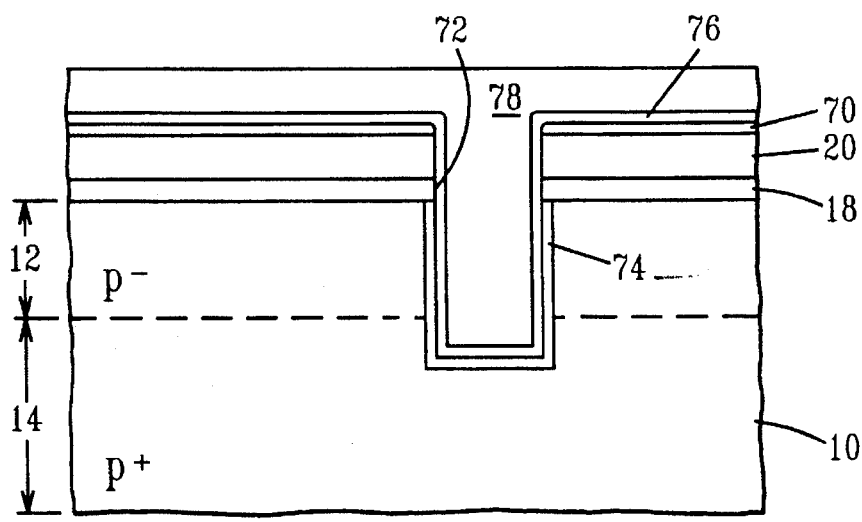

As shown in FIG. 11, a thin layer 74 of thermal oxide is grown on all exposed surfaces of trench 72 followed by the deposition of a nitride layer 76. A planarization resist 78 is then coated on the nitride layer 76 and within trench 72 to provide the structure shown in FIG. 11.

Figure 12:
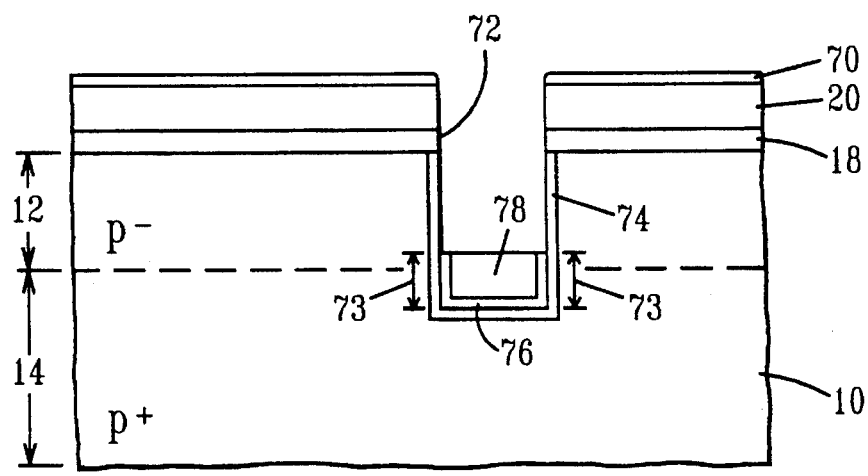
Figure 13:
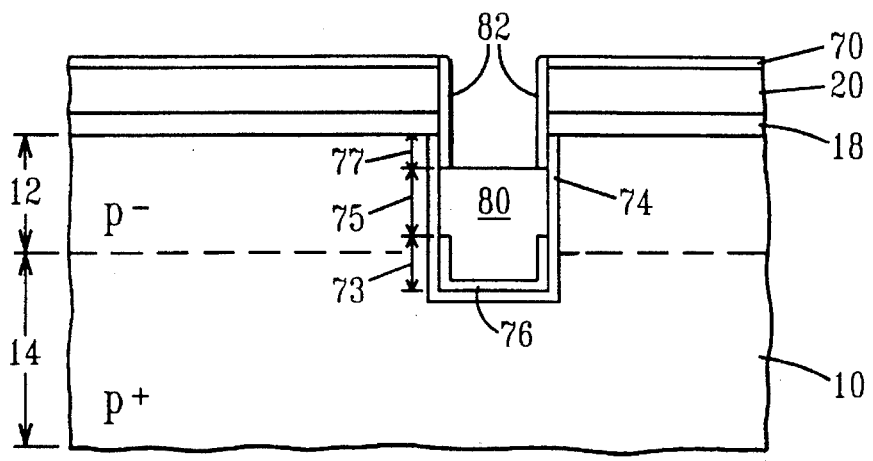

Referring to FIG. 12, the planarization resist 78 is then recessed to a level above the expected depth of an n-well. The exposed nitride layer 76 is then isotropically etched as shown in FIG. 12 leaving only that portion of nitride layer 76 which is below the surface of the remaining planarization resist 78. The remaining planarization resist 78 is removed leaving nitride layer 76 in the first trench region 73. In the next step of the method of the present invention, the trench 72 is filled with intrinsic polysilicon 80. The polysilicon 80 is planarized and polished. Next, the polysilicon is then recessed to a depth below the expected source/drain junction depth to form polysilicon layer 80 in the first and second trench regions 73 and 75 of trench 72 as shown in FIG. 13. A nitride collar 82 is then formed within trench 72 extending from the nitride layer 70 to the surface of polysilicon layer 80.

Figure 14:
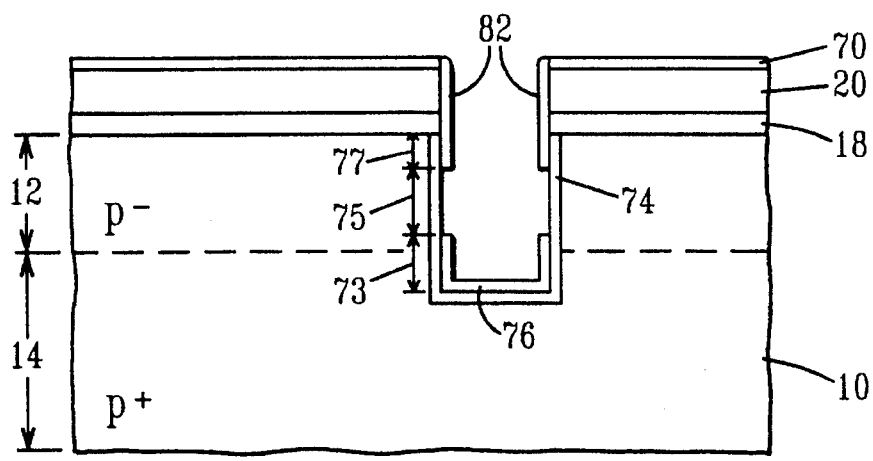
Figure 15:
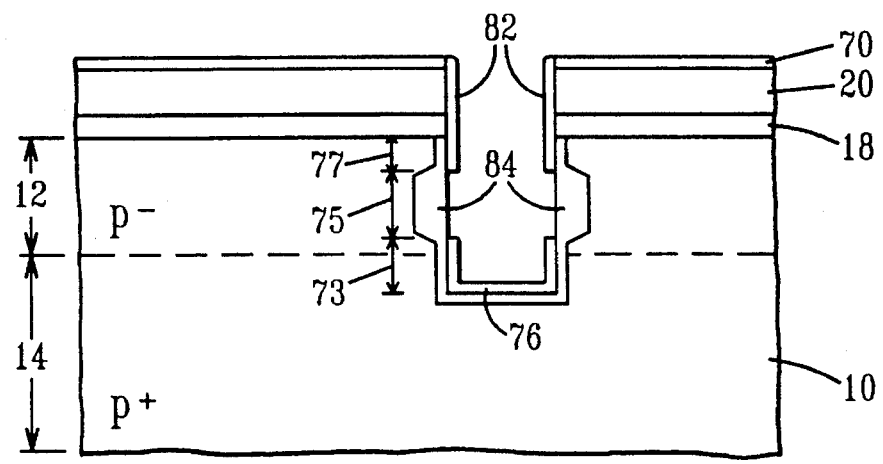

The exposed polysilicon layer 80 is isotropically etched selective to oxide to fabricate the structure shown in FIG. 14. Next, a thermal oxidation is performed wherein the silicon in the upper portion of trench 72 (i.e., second trench region 75) which is not protected by nitride layers 82 and 76 is oxidized to form insulating ring 84. The insulating ring can be comprised of a material such as an oxide (e.g., silicon oxide and silicon dioxide) or oxynitride. To fabricate an oxide ring 84, thermal oxidation can be performed at a temperature between about 850° to 1000° C. for about 30 minutes to 3 hours to form oxide ring 84. Any oxide protruding into trench 72 can be anisotropically etched to produce the oxide ring 84 which surrounds a portion of trench 72 and is contiguous with trench 72 on all sides as shown in FIG. 15. To form an oxynitride ring 84, the steps are the same as that described above with regard to forming an oxide ring except that the thermal oxidation is performed in an atmosphere of nitride or ammonia.

Figure 16:
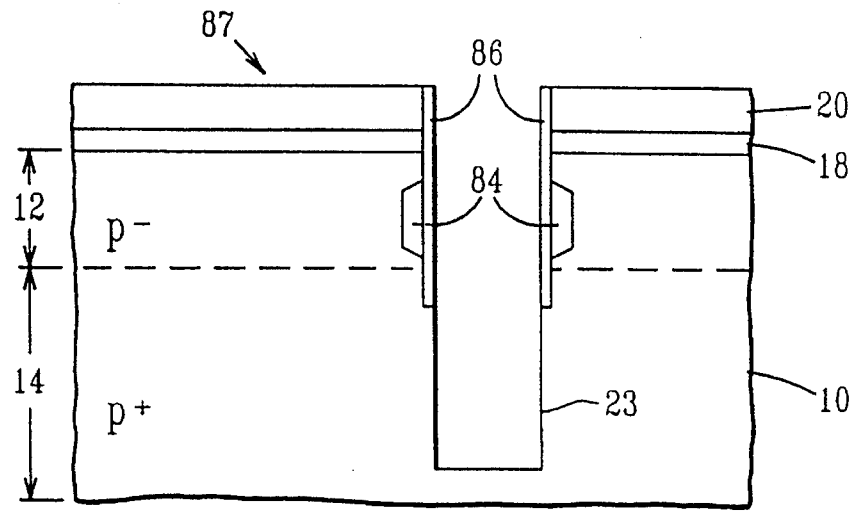

The exposed nitride layers 70, 76 and 82 are then removed by isotropical etching. Turning now to FIG. 16, a nitride layer 86 is formed on all vertical and horizontal surfaces of the trench 72 to the first depth to protect the insulating ring 84. The trench 72 is then etched to a second and final depth to produce the trench 23 and structure 87 shown in FIG. 16. The structure 87 includes the protective nitride layer 86 disposed on the vertical surfaces of the first, second and third regions of trench 72. Thus, the insulating ring 84 surrounds an upper portion of trench 23, is contiguous with trench 23 on all sides and not within trench 23.

Figure 17:
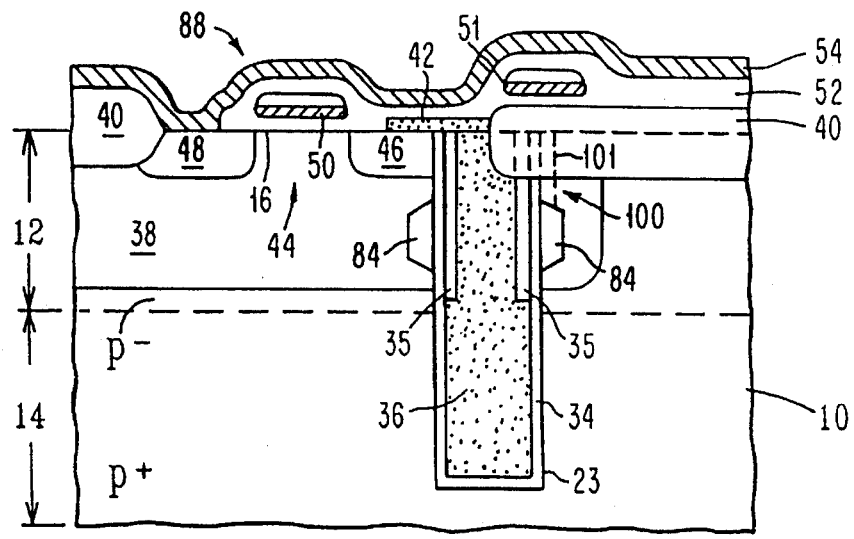

Conventional DRAM processing is followed from here as described above with regard to FIG. 5 to produce the DRAM cell 88 shown in FIG. 17. The insulating ring 84 reduces a trench parasitic sidewall leakage current through the trench sidewall from a bitline contact to the storage node as well as the leakage current from the p+ storage node to the substrate by several orders of magnitude. The thickness of insulating ring 84 may be increased by increasing the time of oxidation to reduce the leakage currents to a desired value.

Figure 18:
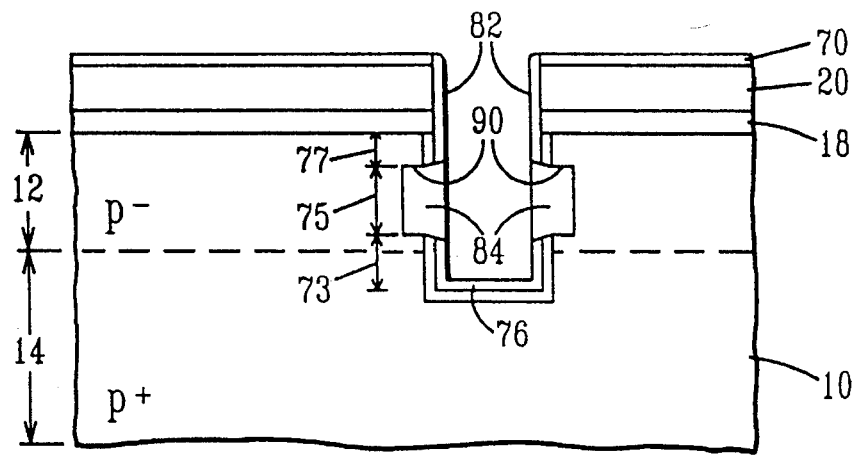
FIG. 18 is a cross-sectional view of an alternative embodiment of the method of the present invention for fabricating the DRAM cell of FIG. 17.

Referring now to FIG. 18 there is shown a cross-sectional view of another embodiment of fabricating the insulating ring of the present invention. First, the structure shown in FIG. 14 is fabricated as described above. Next, as shown in FIG. 18, the exposed silicon sidewalls in the second trench region 75 are isotropically etched to form the sidewall shallow trench 90. The sidewall trench 90 is then filled with an insulating material to produce the insulating ring 84. This can be done by depositing the insulating material within trench 72 and etching back to leave the deposited insulating ring 84 shown in FIG. 18. Suitable materials which can be used for insulating ring 84 include an oxide (e.g., silicon oxide and silicon dioxide), oxynitride and silicon nitride. As described above with regard to FIG. 17, conventional DRAM processing is followed from here to fabricate the DRAM cell 88 shown in FIG. 17.

Figure 19:
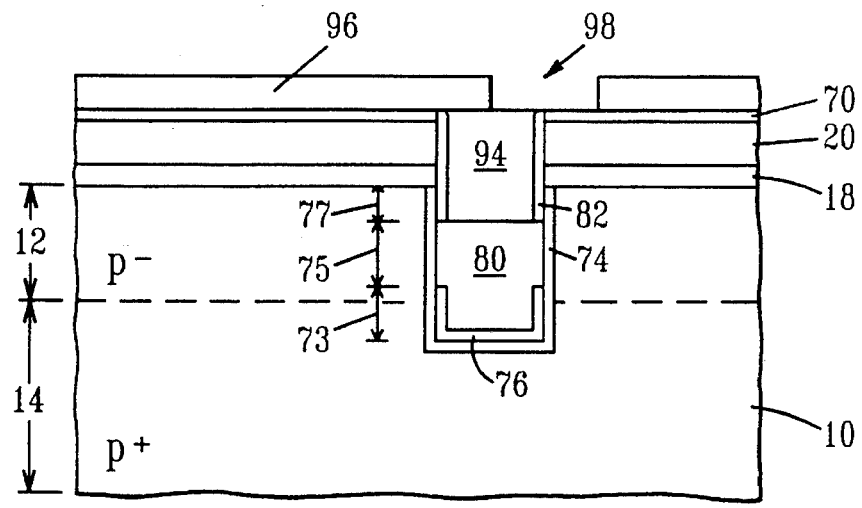
FIGS. 19–21 are cross-sectional views showing the fabrication of another embodiment of a DRAM of the present invention at successive stages in accordance with another embodiment of the method of the present invention.
Figure 20:
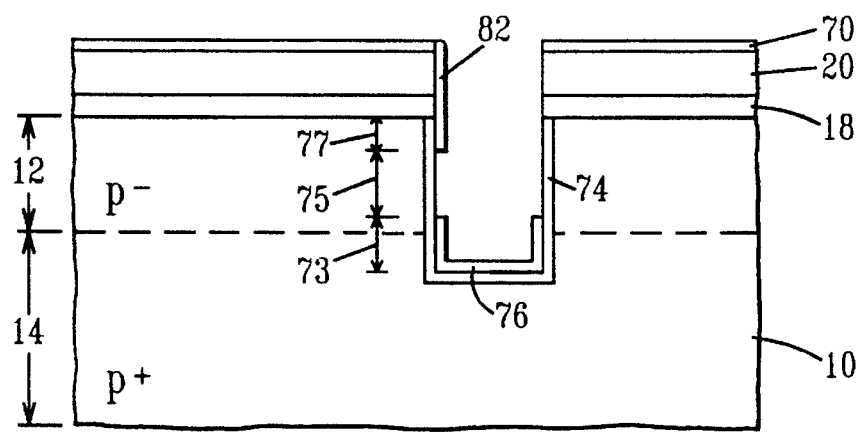

To further reduce the leakage from storage node to bit line contact through the adjacent trench sidewall, in accordance with another embodiment of the present method, one of the sides of trench away from the source/drain diffusion may be selectively oxidized all the way to the surface 16 of the substrate 10. After fabricating the structure shown in FIG. 13 as described above, the trench 72 is filled with a planarization resist and etched back to the surface of nitride layer 70 to form the resist layer 94 as shown in FIG. 19. A photoresist is coated and etched to form masking layer 96 having an opening 98 to expose a portion of nitride layer 82 on the right side of trench 72. The right side of nitride layer 82 is then removed by hot phosphoric acid. The resist 94 is then removed by oxygen plasma cleaning and the polysilicon 80 is removed by plasma etching resulting in the structure shown in FIG. 20.

Figure 21:
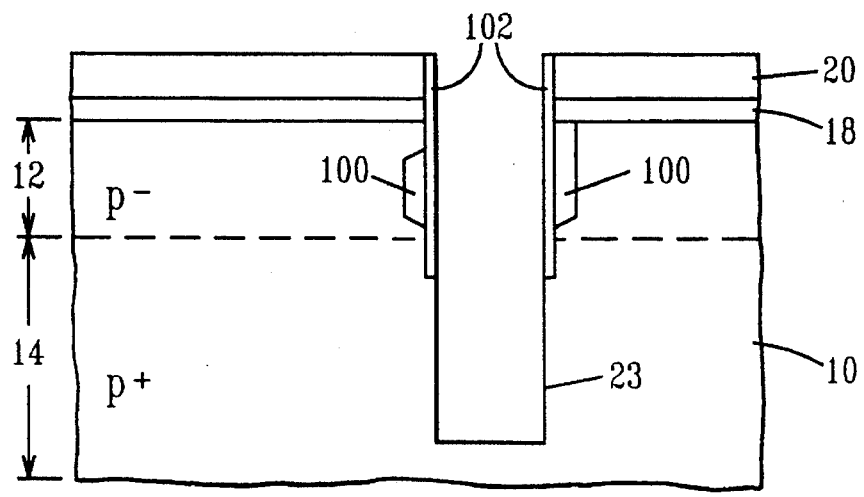

The remaining steps are now identical to those described above with regard to FIGS. 15 to 17 and are summarized below. The silicon not protected by nitride layer 82 or 76 is oxidized and any oxide (or oxynitride) extending into trench 72 is anisotropically etched to form insulating ring 100 as shown in FIG. 21. As shown in FIG. 21, the right side portion of ring 100 extends to the surface of substrate 10 which further reduces the parasitic sidewall leakage current from storage node to bitline contact. The exposed nitride layers 70, 76 and 82 are removed and a nitride layer 102 is formed around the trench 72 to protect insulating ring 100. Trench 72 is then etched to its second and final depth to fabricate the trench 23 and produce the structure shown in FIG. 21. From this point conventional DRAM processing is utilized to fabricate the DRAM cell 88 shown in FIG. 17 which includes insulating ring 100. The insulating ring 100 comprises insulating ring 84 and the dotted line portion 101 which extends to the surface 16 of substrate 10.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described the invention, what we claim as new and desire to secure as Letters Patent is:

1. A method for forming a diffusion ring around a trench of a DRAM cell comprising the steps of:
   (a) providing a substrate having a lightly doped upper portion of one conductivity type overlying a heavily doped lower portion of the same conductivity type;
   (b) forming a protective layer on a surface of said substrate;
   (c) etching a trench to a first depth into said upper portion of said substrate at a first region;
   (d) forming a nitride collar on the sidewall surfaces of said trench;
   (e) etching said trench to a second depth beyond said nitride collar and within said upper portion of said substrate;
   (f) forming a diffusion ring of the second conductivity type extending from said nitride collar and within said upper portion of said substrate; and
   (g) etching said trench to a third depth beyond the upper portion and within the lower portion of the substrate such that said diffusion ring surrounds an upper portion of said trench, said diffusion ring being contiguous with said trench on all sides and not within said trench.

2. The method of claim 1, wherein said step of forming said diffusion ring comprises:
   depositing a doped material having a dopant of the second conductivity type on all surfaces of said trench;
   outdiffusing said dopant into said upper portion of said substrate to form said diffusion ring; and
   removing said doped material from said nitride collar and all vertical and horizontal surfaces of said trench.

3. The method of claim 2, wherein said doped material is a material selected from the group consisting of arsenic doped glass, phosphorous doped glass, and antimony doped glass, and said first and second conductivity types are p-type and n-type respectively.

4. The method of claim 2, wherein said doped material is a material selected from the group consisting of boron doped glass, and indium doped glass, and said first and second conductivity types are n-type and p-type respectively.

5. The method of claim 2, wherein said out diffusing step comprises heating the structure to drive the dopant into the substrate trench sidewalls.

6. The method of claim 5, wherein said out diffusing step comprises heating the structure to a temperature between 900° C. and 1200° C. for a period of one to six hours to drive the dopant into the substrate trench sidewalls.

7. The method of claim 1, wherein said step of forming said nitride collar further includes the step of removing a portion of said nitride collar from a sidewall of said trench such that a portion of said diffusion ring extends to a surface of said substrate.

8. The method of claim 7, wherein said step of removing a portion of said nitride collar includes the steps of:
   depositing a planarization resist within said trench;
   masking a portion of said filled trench;
   removing a portion of said nitride collar; and
   removing said planarization resist.

9. The method of claim 1, further including the step of forming a region of a second conductivity type in said upper portion of said substrate, said region extending from the surface of said substrate and beyond the diffusion ring, said diffusion ring being disposed entirely within said region.

10. The method of claim 1, wherein said step of forming said protective layer comprises:
    depositing a nitride layer on the surface of said substrate; and
    depositing an oxide layer on said nitride layer.

11. The method of claim 1, wherein said step of forming the nitride collar comprises:
    depositing a nitride layer on all surfaces of said trench;
    etching the nitride collar formed on the horizontal surface of the trench to leave the nitride collar on all vertical sidewall surfaces of the trench.

12. A method of forming an insulating ring around a trench of a DRAM cell comprising the steps of:
    (a) providing a substrate having a lightly doped upper portion of one conductivity type overlying a heavily doped lower portion of the same conductivity type:
    (b) forming a protective layer on a surface of said upper portion of the substrate;
    (c) etching a trench to a first depth into said upper portion of said substrate at a first region;
    (d) forming an oxide layer on all surface of said trench below said substrate surface; and
    (e) selectively exposing an annular portion of said upper portion of said substrate by removing a portion of said oxide layer and forming an insulating ring within said exposed annular portion of said upper portion of said substrate, spaced from said substrate surface and surrounding a portion of the trench, said insulating ring being continuous with said trench on all sides and not within said trench.

13. The method of claim 12, further including the step of forming a region of a second conductivity type in said lightly doped upper portion of said substrate, said region extending from the surface of said substrate and beyond the insulating ring, said insulating ring being disposed entirely within said region.

14. The method of claim 12, wherein said step of forming said protective layer comprises:

depositing a first nitride layer on the surface of said substrate;

depositing an oxide layer on said first nitride layer; and depositing a second nitride layer on said oxide layer.

15. The method of claim 12 wherein said trench comprises first, second and third contiguous regions, said first region being a horizontal surface and lower vertical surface of said trench, said third region being vertical surfaces of an uppermost portion of the trench and said second region being vertical surfaces of said trench between said first and third regions, said insulating ring being formed at said second region of said trench, said insulating ring forming step further including forming a nitride layer on first and third regions of said trench over said oxide layer.

16. The method of claim 15, wherein said step of forming said nitride layer comprises:

depositing a nitride layer within said trench over said oxide layer;

forming a planarization resist within said trench on said nitride layer and recessing said resist to leave said resist within said first trench region;

etching said nitride layer to leave a nitride layer only on said first trench region;

depositing polysilicon in said first and second trench regions;

forming a nitride collar on said third trench region; and isotropically etching said polysilicon while leaving said nitride layer on said third trench region.

17. The method of claim 15, wherein said step of forming the insulating ring comprises:

growing said oxide layer on said second region subsequent to the exposure thereof; and anisotropically etching any of said nitride layer that is within said trench.

18. The method of claim 17, wherein said growing step is performed in an atmosphere of nitride.

19. The method of claim 17, wherein said growing step is performed in an ammonia atmosphere.

20. The method of claim 15, further including the step of anisotropically etching said nitride layer to remove the nitride layer from the first and third regions of said trench.

21. The method of claim 20, further including the step of:

etching said trench to a second depth within said heavily doped lower portion of said substrate such that said insulating ring surrounds an upper portion of said trench, said insulating ring being contiguous with said trench on all sides and not within said trench.

22. The method of claim 15, wherein said step of forming a nitride layer further comprises removing said nitride layer from one vertical surface of said third trench region such that during said step of forming the insulating ring a portion of said insulating ring at said one vertical surface extends to the surface of said substrate.

23. The method of claim 22, wherein said step of removing said nitride layer comprises:

forming a planarization resist within said trench to a level substantially equal to that of the surface of said protective layer;

forming a mask on said surface having an opening;

removing said nitride layer from said one vertical surface; and removing said planarization resist.

24. The method of claim 12, wherein said step of forming the insulating ring comprises:

isotropically etching said portion of said trench to form a shallow annular recessed region in the sidewall of said trench;

depositing an insulating material within said trench and said shallow annular recessed region; and etching said insulating material within said trench to leave a portion of said insulating material within said shallow annular recessed region.

* * * * *